US011133147B2

(12) United States Patent
Yokosuka et al.

(10) Patent No.: US 11,133,147 B2
(45) Date of Patent: Sep. 28, 2021

(54) CHARGED PARTICLE RAY DEVICE AND CROSS-SECTIONAL SHAPE ESTIMATION PROGRAM

(71) Applicant: HITACHI HIGH-TECHNOLOGIES CORPORATION, Tokyo (JP)

(72) Inventors: Toshiyuki Yokosuka, Tokyo (JP); Hajime Kawano, Tokyo (JP); Kouichi Kurosawa, Tokyo (JP); Hideyuki Kazumi, Tokyo (JP); Chahn Lee, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/645,511

(22) PCT Filed: Aug. 24, 2018

(86) PCT No.: PCT/JP2018/031371
§ 371 (c)(1),
(2) Date: Mar. 9, 2020

(87) PCT Pub. No.: WO2019/082497
PCT Pub. Date: May 2, 2019

(65) Prior Publication Data
US 2020/0294756 A1    Sep. 17, 2020

(30) Foreign Application Priority Data
Oct. 24, 2017   (JP) .............................. JP2017-205279

(51) Int. Cl.
*H01J 37/05*    (2006.01)
*H01J 37/28*    (2006.01)
(Continued)

(52) U.S. Cl.
CPC ............ *H01J 37/05* (2013.01); *H01J 37/222* (2013.01); *H01J 37/244* (2013.01); *H01J 37/28* (2013.01); *H01J 2237/2817* (2013.01)

(58) Field of Classification Search
CPC .. H01J 37/244; H01J 37/28; H01J 2237/2817; H01J 2237/2448;
(Continued)

(56) References Cited

U.S. PATENT DOCUMENTS 6,043,491 A  *  3/2000  Ose ....................... H01J 37/244
                                                       250/310
9,202,667 B2 * 12/2015  Hatano ................... H01J 37/28
(Continued)

FOREIGN PATENT DOCUMENTS

CN     101490538 A     7/2009
JP     61-290312 A    12/1986
(Continued)

OTHER PUBLICATIONS

Daisuke Bizen et al., "High-precision CD measurement using energy-filtering SEM techniques" Proceedings of SPIE vol. 10145, Mar. 28, 2017; San Jose, California.
(Continued)

*Primary Examiner* — David A Vanore
(74) *Attorney, Agent, or Firm* — Mattingly & Malur, PC

(57) ABSTRACT

The purpose of the present invention is to provide a charged particle ray device which is capable of simply estimating the cross-sectional shape of a pattern. The charged particle ray device according to the present invention acquires a detection signal for each different discrimination condition of an energy discriminator, and estimates the cross-sectional shape of a sample by comparing the detection signal for each discrimination condition with a reference pattern (see FIG. 5).

12 Claims, 12 Drawing Sheets

(51) Int. Cl.
*H01J 37/22* (2006.01)
*H01J 37/244* (2006.01)

(58) Field of Classification Search
CPC ..... H01J 2237/2449; H01J 2237/24465; H01J 2237/24592; H01J 37/05; H01J 37/147; H01J 37/222; H01J 2237/026; H01J 2237/0453; H01J 2237/047; H01J 2237/0475; H01J 2237/04756; H01J 2237/06316; H01J 2237/0635; H01J 2237/1508; H01J 2237/2441; H01J 2237/24475; H01J 2237/24485; H01J 2237/24495; H01J 2237/24578; H01J 2237/26; H01J 2237/2806; H01J 2237/281; H01J 2237/2816; H01J 37/063; H01J 37/073; H01J 37/09; H01J 37/10; H01J 37/1471; H01J 37/1472; H01J 37/22; H01J 37/265; H01J 37/3174; H01J 3/021; H01J 3/10; H01J 49/488; G01N 23/2251; G01N 2035/0437; G01N 23/04; G01N 23/22; G01N 23/225; G01N 33/483; G01N 35/00; G01N 35/00623; G01N 35/0092; G01N 35/02; G01N 35/08; G01N 35/10; G01N 35/1004
USPC .... 250/310, 370.14, 394, 307, 395, 396 ML
See application file for complete search history.

(56) References Cited

U.S. PATENT DOCUMENTS

| | | | | |
|---|---|---|---|---|
| 9,336,984 | B2* | 5/2016 | Bizen | H01J 37/28 |
| 10,942,194 | B2* | 3/2021 | Noda | G01N 35/00623 |
| 2003/0155509 | A1* | 8/2003 | Nakasuji | G01N 23/2251 |
| | | | | 250/310 |
| 2005/0133718 | A1 | 6/2005 | Miyamoto et al. | |
| 2006/0226361 | A1* | 10/2006 | Frosien | H01J 37/244 |
| | | | | 250/310 |
| 2007/0198955 | A1 | 8/2007 | Nagatomo et al. | |
| 2009/0147247 | A1 | 6/2009 | Endo et al. | |
| 2011/0163229 | A1* | 7/2011 | Frosien | H01J 37/10 |
| | | | | 250/310 |
| 2013/0032716 | A1* | 2/2013 | Nakasuji | H01J 37/063 |
| | | | | 250/310 |
| 2013/0245989 | A1 | 9/2013 | Kadowaki et al. | |
| 2013/0270438 | A1* | 10/2013 | Lanio | H01J 37/244 |
| | | | | 250/310 |
| 2013/0270439 | A1* | 10/2013 | Adamec | H01J 37/244 |
| | | | | 250/310 |
| 2014/0361164 | A1 | 12/2014 | Ogawa et al. | |
| 2015/0221471 | A1* | 8/2015 | Hatano | H01J 37/222 |
| | | | | 250/307 |
| 2018/0012725 | A1 | 1/2018 | Yokosuka et al. | |
| 2018/0182595 | A1* | 6/2018 | Yokosuka | G03F 7/70625 |

FOREIGN PATENT DOCUMENTS

| | | |
|---|---|---|
| JP | 2007227618 A | 9/2007 |
| JP | 2010175249 A | 8/2010 |
| JP | 2013-69693 A | 4/2013 |
| JP | 2013134879 A | 7/2013 |
| JP | 2014238982 A | 12/2014 |
| KR | 10-2017-0098286 A | 8/2017 |
| TW | 201712297 A | 4/2017 |
| WO | 2017/051621 A1 | 3/2017 |

OTHER PUBLICATIONS

Makoto Suzuki et al., "Secondary electron imaging of embedded defects in carbon nanofiber via interconnects", Applied Physics Letters 93, 263110 (2008).

International Search Report of PCT/JP2018/031371 dated Oct. 16, 2018.

Notice of Allowance issued in corresponding Taiwan Patent Application No. 107130511 dated Jul. 3, 2020.

Korean Office Action received in corresponding Korean Application No. 10-2020-7007337 dated Aug. 6, 2021.

* cited by examiner

FIG. 8
(a)
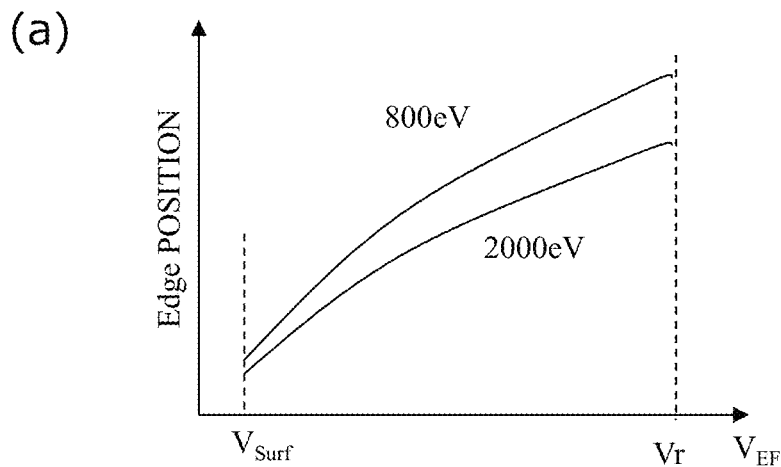
(b)
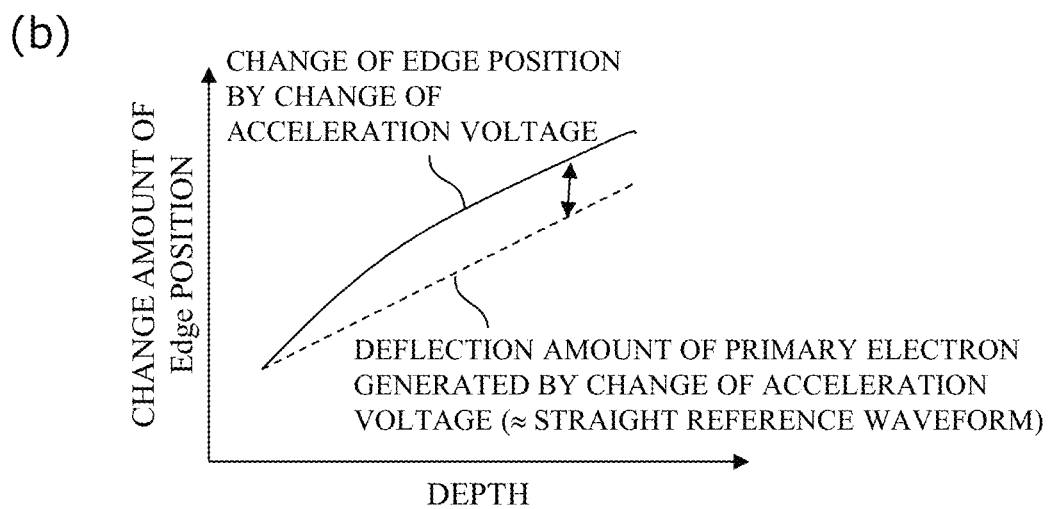
(c)
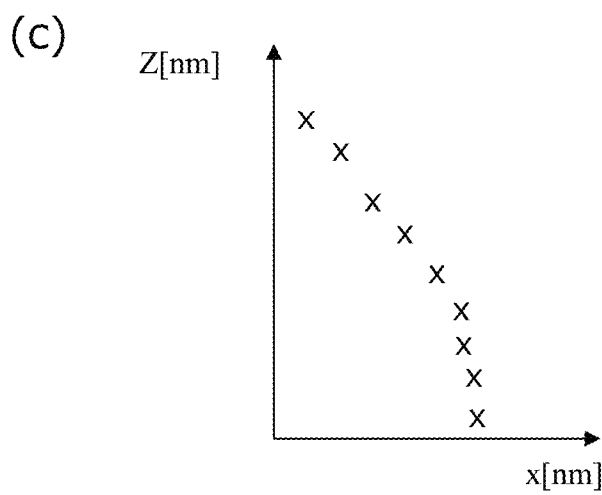

CHARGED PARTICLE RAY DEVICE AND CROSS-SECTIONAL SHAPE ESTIMATION PROGRAM

TECHNICAL FIELD

The present invention relates to a charged particle ray device.

BACKGROUND ART

With the miniaturization and high integration of semiconductor patterns, a slight difference in shape has an influence on the operation characteristics of a device, and the need for shape management is increasing. Therefore, a scanning electron microscope (SEM) used for inspection/measurement of semiconductor is required to have higher sensitivity and higher accuracy than ever before. In addition to the recent trend toward pattern miniaturization and the development of high aspect ratios in which devices are stacked in the height direction, the need for measurement of three-dimensional structures is increasing. The following method is disclosed for dimension estimation at a specific depth.

PLT 1 below discloses a method for determining a depth of a defect by charging a sample surface in advance and limiting the energy of secondary electrons to be detected. PLT 2 below also discloses a method for measuring a pattern dimension at a specific depth by applying charges to a sample surface in advance.

NPL 1 below discloses a method in which charges are previously formed on a sample, and an energy filter cuts low-energy electrons to determine a pattern dimension at a specific depth. PLT 3 below discloses a method for learning a cross-sectional shape of a pattern and an SEM image of an upper surface of a sample and utilizing the learned SEM image as a database.

With the miniaturization of pattern dimensions, the influence of void patterns (cavities inside a sample) formed in a film forming process on device characteristics increases, and thus the need for inspecting and measuring void patterns is increasing. NPL 2 below discloses a method for determining a buried void pattern by optimizing an acceleration energy of an electron beam to be irradiated.

CITATION LIST

Patent Literature

PTL 1: JP 2014-238982 A
PTL 2: JP 2010-175249 A
PTL 3: JP 2007-227618 A

Non-Patent Literature

NPL 1: Proc. SPIE 10145, Metrology, Inspection, and Process Control for Microlithography XXXI, 101451K (28 Mar. 2017)
NPL 2: Applied Physics Letters 93, 263110 (2008)

SUMMARY OF INVENTION

Technical Problem

As disclosed in PLT 1, in a case where the pattern is made of an insulator material, a potential difference between the pattern surface and the pattern bottom can be formed by setting charging on the surface. In this case, a uniform potential gradient is formed from the pattern surface to the bottom, and the energy of the secondary electrons can be discriminated for each position in the depth direction. By analyzing the energy of the signal at the location where the defect seems to be, it is possible to estimate at what depth the defect is. Similarly, in the method disclosed in PLT 2, it can be determined whether a signal at the hole bottom is detected or a signal in the middle of the hole is detected. NPL 1 further estimates a pattern dimension at a specific depth by using an energy filter. However, according to the methods described in PTL 1, PTL 2, and NPL 1, although information such as at which depth a defect is present and the dimension of the defect is obtained, it is difficult to determine the cross-sectional shape of the pattern. For example, it is difficult to determine the cross-sectional shape such as the degree of inclination (taper angle) of the pattern because the primary electrons are deflected by the charging of the pattern.

In the method disclosed in PLT 3, it is necessary to prepare a database for each shape/material of the pattern, so that the burden of preliminary preparation is large. In addition, if charging varies due to a change in material characteristics or the like, estimation accuracy may be reduced.

In NPL 2, voids are measured by optimizing the acceleration conditions. However, since the optimal acceleration conditions vary depending on the depth and size of the voids, it takes time to search for the optimal conditions for each wafer or chip.

The invention has been made in view of the above-described problems, and an object thereof is to provide a charged particle ray device that can easily estimate a cross-sectional shape of a pattern.

Solution to Problem

A charged particle ray device according to the invention acquires a detection signal for each different discrimination condition of an energy discriminator, and estimates a cross-sectional shape of a sample by comparing a detection signal for each discrimination condition with a reference pattern.

Advantageous Effects of Invention

According to a charged particle ray device according to the invention, an edge position at a specific depth is measured using an energy discriminator, and the measured edge position is compared with a reference pattern, so that the cross-sectional shape of the sample can be estimated by a simple method.

BRIEF DESCRIPTION OF DRAWINGS

FIG. 8 is a diagram describing a method for estimating a cross-sectional shape in a second embodiment.

DESCRIPTION OF EMBODIMENTS

As a device for measuring and inspecting a fine pattern of a semiconductor device with high accuracy, a need for a scanning electron microscope is increasing. The scanning electron microscope is a device that detects electrons emitted from a sample, generates a signal waveform by detecting such electrons, and measures, for example, a dimension between signal waveform peaks (corresponding to the edge of the pattern).

The electrons emitted from the sample hold information indicating a charged (potential) state of the emission position of the sample. For example, secondary electrons emitted from a positively charged location and secondary electrons emitted from a negatively charged location enter a detector while maintaining the charged difference (potential difference) at the emission location. Even if secondary electrons have low emission energies (mostly a few eV), by using such characteristics, it is possible to estimate the charged potential of the emission location or specify the emission location from the energy of the secondary electron.

In recent years, with the miniaturization of semiconductor devices, device structures such as FinFETs and Nanowires have become more complicated, and there is a trend toward higher aspect ratios in which devices are stacked in three-dimensional direction such as NAND flash memories. For example, as a contact hole, a very deep hole having a diameter of several μm has been processed with respect to several tens of nm. Therefore, it is necessary to check whether the hole is normally opened straight. In particular, since a bowing shape or a reverse taper shape of a hole side wall cannot be determined from a Top-View image by a scanning electron microscope, a destructive inspection in which a cross section is divided and a pattern shape is confirmed by TEM or the like is adopted. On the other hand, as the device structure becomes more complicated and the aspect ratio increases, the need for confirming the cross-sectional shape of the pattern is increasing, and a longer development period and an increase in cost by observing the cross-sectional shape have become issues.

In the following embodiments, a method for estimating a cross-sectional shape of a pattern without destroying a sample from a Top-View image of the sample obtained using a scanning electron microscope will be described in view of the problems described above.

First Embodiment

Figure 1:
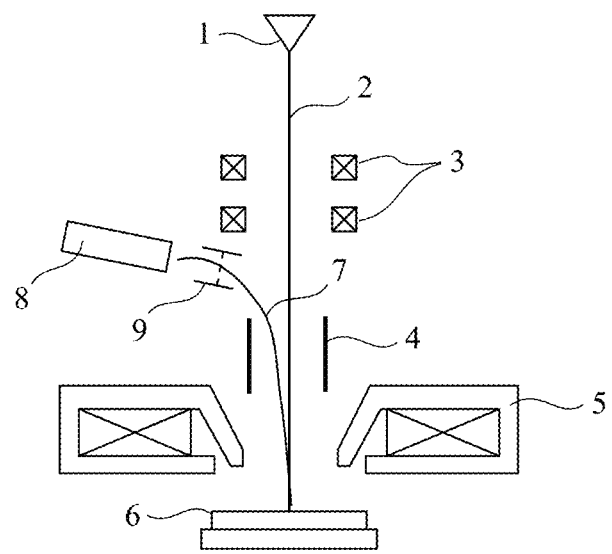
FIG. 1 is a configuration diagram of a charged particle ray device according to a first embodiment.

FIG. 1 is a configuration diagram of a charged particle ray device according to a first embodiment of the invention. The charged particle ray device according to the first embodiment is configured as a scanning electron microscope. An electron beam 2 generated from an electron gun 1 is converged by a condenser lens 3 and converged on Sample 6 by an objective lens 5. A deflector 4 (scanning deflector) scans the surface of Sample 6 with the electron beam 2 (primary electron). By scanning and irradiating the primary electron two-dimensionally, a secondary electron 7 is excited in Sample 6 and emitted from Sample 6. A detector 8 detects the secondary electron 7 and outputs a detection signal indicating the intensity. Sample 6 is observed and measured by converting the detection signal into an image. An energy discriminator 9 (configured as a high-pass filter or a band-pass filter) is provided in a front stage of the detector 8, and passes only the secondary electron 7 having energy falling within a specific range.

The scanning electron microscope of FIG. 1 includes a control device (not illustrated), and the control device controls each optical element of the scanning electron microscope and controls a discrimination condition of the energy discriminator 9. A negative voltage applying power source (not illustrated) is connected to a sample stage on which Sample 6 is placed. The control device controls energy when the electron beam 2 reaches Sample 6 by controlling the negative voltage applying power source. The invention is not limited to the above configuration, and the energy of the electron beam 2 may be controlled by controlling an acceleration power source connected between an acceleration electrode for accelerating the electron beam 2 and an electron source. The scanning electron microscope illustrated in FIG. 1 includes an image memory that stores a detection signal for each pixel, and the detection signal is stored in the image memory.

The scanning electron microscope exemplified in FIG. 1 includes an arithmetic device (not illustrated). The arithmetic device estimates a cross-sectional shape of the pattern based on the image data stored in the image memory. More specifically, for each energy discrimination condition, a shape profile waveform is formed based on luminance information stored in each pixel of the image, and an edge position of the pattern is obtained using the waveform. By comparing the obtained edge position with the edge position of the reference pattern, the edge position (that is, cross-sectional shape) at each depth position of Sample 6 is estimated. The details will be described below.

Figure 2:
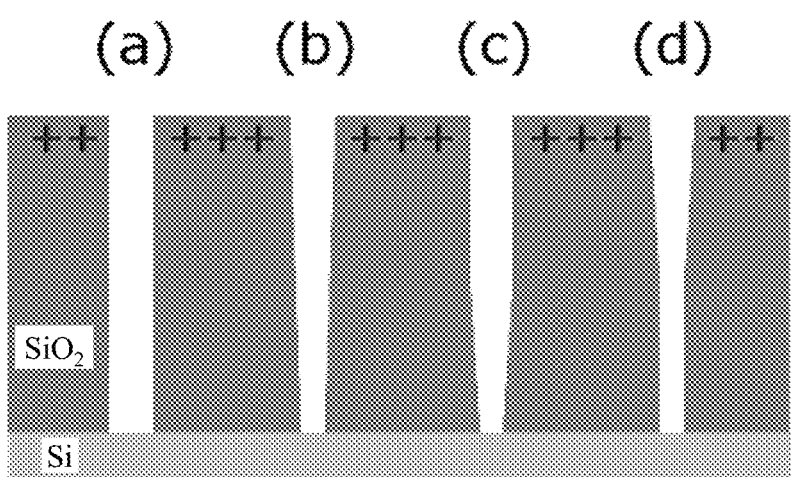
FIG. 2 is a schematic view of a side cross section exemplifying a hole pattern of Sample 6.

FIG. 2 is a schematic view of a side cross section illustrating a hole pattern of Sample 6. (a) is a pattern in which the side wall shape is straight, and this is used as a reference pattern in the first embodiment. (b) is a pattern which is uniformly inclined from the surface toward the hole bottom. (c) is a pattern with a straight hole up to half of the hole and a uniform slope below therefrom. (d) is a pattern with a uniform slope up to half of the hole and a straight pattern below therefrom. If the cross-sectional shape is known, any of (b) to (d) may be used as a reference pattern.

As illustrated by + on the pattern surface in FIG. 2, positive charging is previously formed by pre-dosing the pattern. The positive charging as illustrated in FIG. 2 can be formed on the pattern surface if a pulling electric field is set on Sample 6 and a wide area is irradiated with the electron beam 2 under an acceleration condition in which the secondary electron emission coefficient becomes 1 or more.

Figure 3:
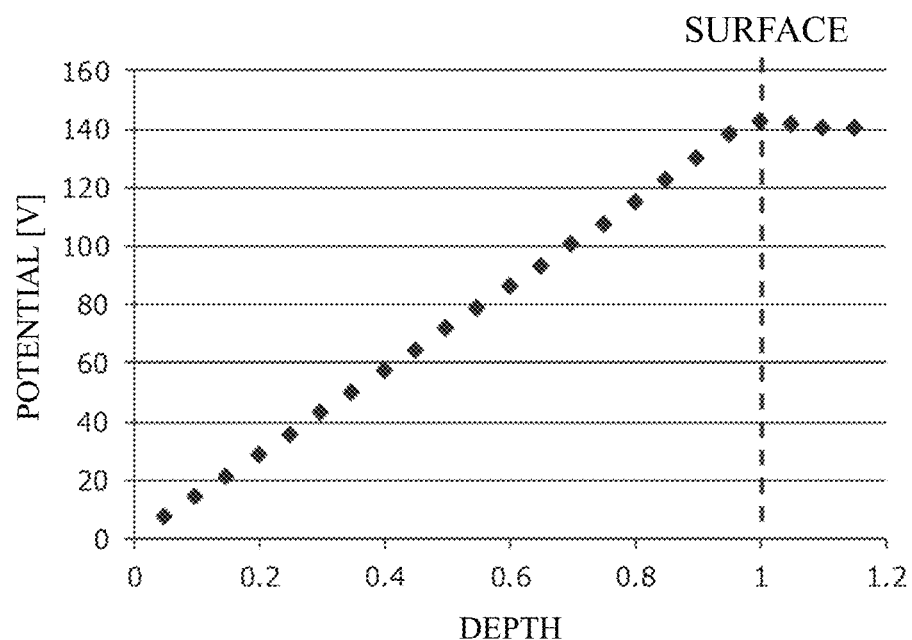
FIG. 3 is an example of a potential gradient in a hole.

FIG. 3 is an example of a potential gradient in a hole. Herein, the potential gradient when the hole bottom is 0 V and the surface is 140 V positively charged is illustrated. The horizontal axis in FIG. 3 indicates the relative position in the depth direction when the surface is 1 and the hole bottom is 0. The vertical axis in FIG. 3 indicates the potential at each depth position. In a case where the material forming a hole is uniform, a uniform potential gradient is formed from the surface to the bottom of the hole. Since the secondary electron 7 holds the information on the potential at the emission location, it is possible to determine from which depth the secondary electron 7 have been emitted by detecting the secondary electron 7 having energy falling within a specific range.

Figure 4:
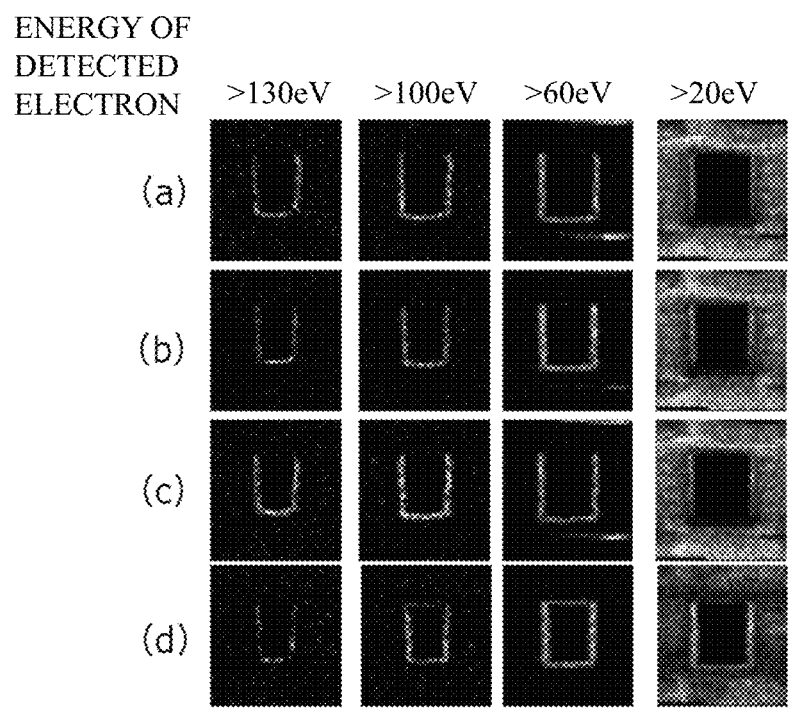
FIG. 4 is an example of an SEM image generated for each energy of secondary electrons 7.

FIG. 4 is an example of an SEM image generated for each energy of the secondary electrons 7. Since the electron beam 2 is deflected by the charging of the surface of Sample 6, it is necessary to increase the energy of the electron beam 2 (that is, increasing the acceleration voltage) in order to make the electron beam 2 reach a position deeper than the hole. Therefore, the leftmost of FIG. 4 represents the planar shape at the deepest position of the hole, and the rightmost represents the planar shape at the shallowest position of the hole. Since this image is obtained in a state where the electron beam 2 is deflected by the charging of the surface of Sample 6, it is difficult to estimate the cross-sectional shape of Sample 6 using only this image.

Figure 5:
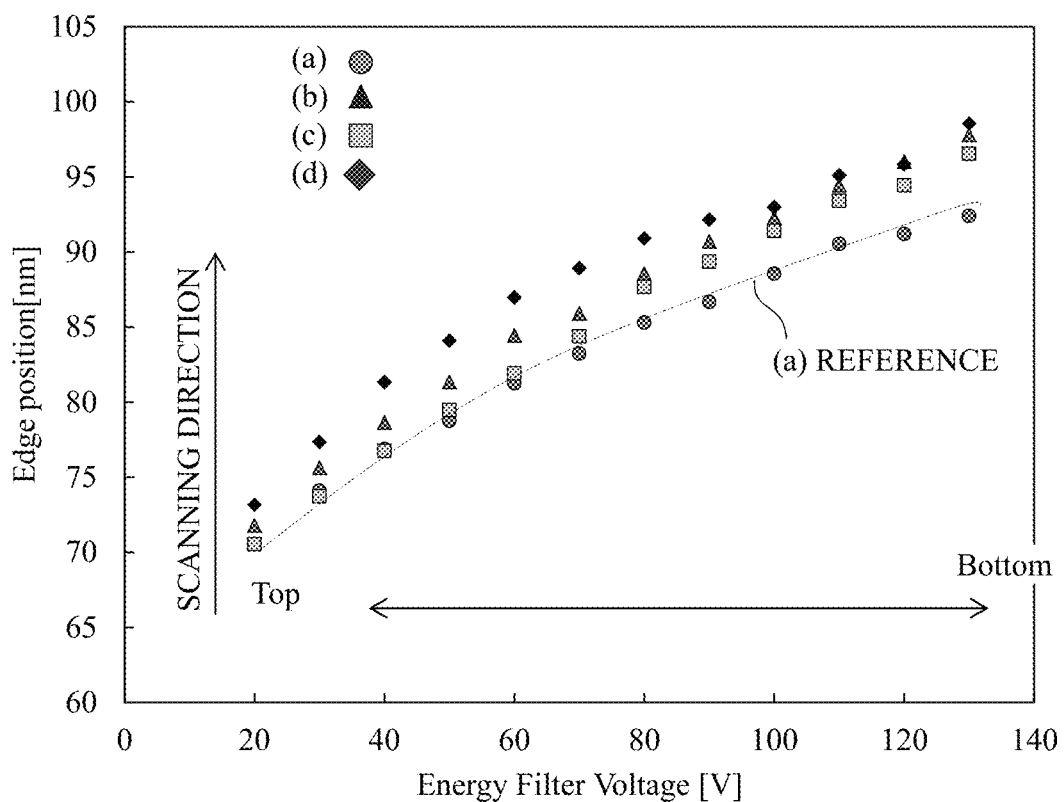
FIG. 5 illustrates an edge position of a pattern extracted from each SEM image illustrated in FIG. 4.

FIG. 5 illustrates an edge position of a pattern extracted from each SEM image illustrated in FIG. 4. Herein, the result of detecting only the position of the left edge of the pattern of FIG. 4 is illustrated. In order to supplement data points, edge position is obtained for energy values other than those illustrated in FIG. 4. Since the reference pattern (a) has a straight hole, the edge position should be constant regardless of the depth. However, since the electron beam 2 is deflected by charging the surface of Sample 6, the actual detected edge position is shifted greatly as it comes close to the hole bottom.

Assuming that the deflection amount of the electron beam 2 due to charging is substantially the same, a difference between the edge position of the reference pattern (a) and the edge position of each pattern can be regarded as representing the cross-sectional shape of each pattern. In the first embodiment, the cross-sectional shape of Sample 6 is estimated using this fact.

Figure 6:
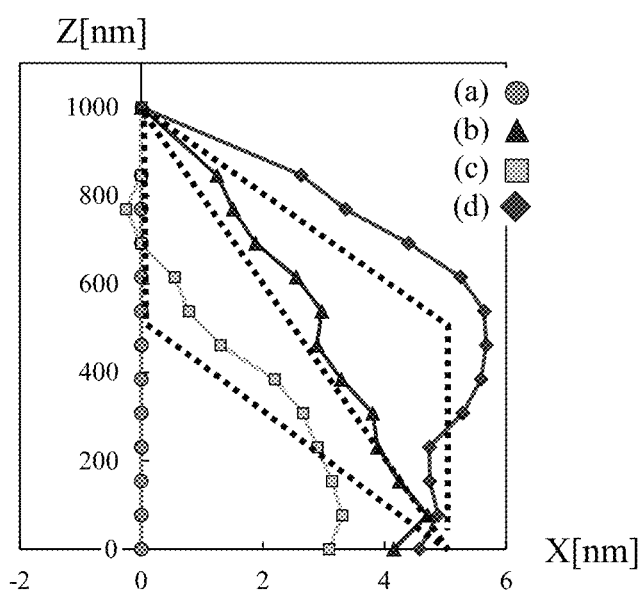
FIG. 6 illustrates a result of estimating a cross-sectional shape using a difference between edge positions illustrated in FIG. 5.

FIG. 6 illustrates the result of estimating the cross-sectional shape using the difference between the edge positions illustrated in FIG. 5. Since the energy of the secondary electron 7 corresponds to the detection depth, the horizontal axis of FIG. 5 corresponds to the depth of Sample 6. Since it can be seen that the reference pattern (a) has a straight hole shape, the difference between the hole edge position in the pattern (a) and the hole edge position in the other patterns (b) to (d) indicates how much it deviates from the straight shape. The solid line in FIG. 6 is the edge position of each pattern estimated using this fact. The dotted line in FIG. 6 is an edge position obtained in advance by simulation. Although the number of pixels in the simulation is small and the estimation result varies, the difference in the shapes of the three patterns (b), (c) and (d) can be determined, and the position where the inclination angle of the side wall changes can also be determined.

Figure 7:
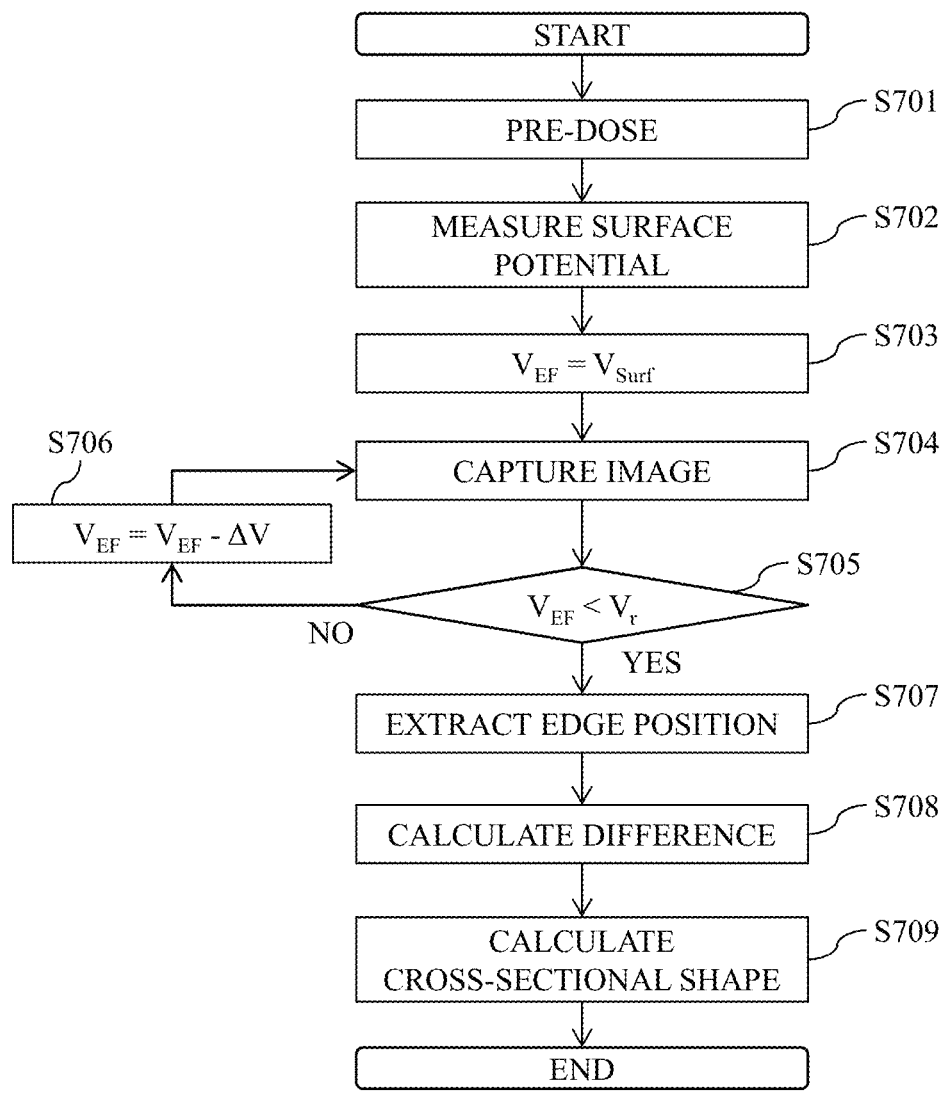
FIG. 7 is a flowchart describing a procedure for estimating a cross-sectional shape of Sample 6 by a scanning electron microscope according to the first embodiment.

FIG. 7 is a flowchart for describing a procedure for estimating the cross-sectional shape of Sample 6 by the scanning electron microscope according to the first embodiment. The edge position at each depth corresponding to the reference pattern (a) is obtained in advance. Hereinafter, each step of FIG. 7 will be described.

(FIG. 7: Step S701)

The charged particle ray device forms a potential difference between the surface and the bottom of Sample 6 (pre-dose). Herein, a pre-dose is incorporated to provide a potential gradient in the depth direction. However, if a potential difference corresponding to the resolution of energy discrimination is provided by ordinary scanning, the pre-dose is unnecessary.

(FIG. 7: Step S702)

The charged particle ray device measures the charged potential ($V_{Surf}$) on the surface of Sample 6. The charged potential can also be obtained based on, for example, a luminance distribution of each part of an observation image of Sample 6 obtained by performing energy discrimination. Alternatively, it may be obtained by an appropriate method.

(FIG. 7: Steps S703 to S706)

The charged particle ray device uses $V_{Surf}$ as an initial value of the energy discrimination voltage ($V_{EF}$) and acquires an observation image while changing the discrimination voltage. Herein, the process is repeated while changing $V_{EF}$ by 10 V until the original surface potential $V_r$ in the state without the pre-dose is reached. The variation width of $V_{EF}$ can be set arbitrarily. As the variation width is reduced, the shape in the depth direction can be estimated with higher resolution.

(FIG. 7: Step S707)

The charged particle ray device extracts an edge position of a cross-sectional shape from each energy discrimination image (EF image) for each position in the depth direction. For example, in the observation image illustrated in FIG. 4, the position of each side of the hole is set as an edge position and extracted for each position in the depth direction. This step corresponds to extracting each measurement point in FIG. 5.

(FIG. 7: Steps S708 to S709)

The charged particle ray device compares the edge position obtained from each EF image with the edge position in the reference pattern to obtain a difference in edge position between the two (S708). The charged particle ray device estimates the cross-sectional shape of Sample 6 using the obtained difference (S709). These steps correspond to obtaining the estimation result of FIG. 6 by obtaining the difference between the measurement point of the reference pattern and the measurement point of each pattern in FIG. 5.

First Embodiment: Summary

The charged particle ray device according to the first embodiment extracts an edge position of a cross-sectional shape from each energy discrimination image, and compares the extracted edge position with an edge position of a cross-sectional shape in the reference pattern whose shape is known in advance, thereby estimating the cross-sectional shape of an unknown pattern. With this configuration, even if the cross-sectional shape is unknown, the cross-sectional shape can be estimated without destroying the sample.

Second Embodiment

In the first embodiment, an example has been described in which a cross-sectional shape is estimated by comparing a measurement result with a known reference pattern. In a second embodiment of the invention, the description will be given about a method for estimating a cross-sectional shape by comparing an edge position acquired using a plurality of acceleration conditions with a deflection amount of the electron beam 2. Since the configuration of the charged particle ray device is the same as that of the first embodiment, the estimation procedure will be mainly described below.

FIG. 8 is a diagram describing a method for estimating a cross-sectional shape in the second embodiment. First, a pre-dose is performed on Sample 6 under a certain acceleration condition (for example, 800 eV), and each energy discrimination image is acquired. Next, the pre-dose is performed on the same Sample 6 under a different acceleration condition (for example, 2000 eV), and each energy discrimination image is obtained (FIG. 8(*a*)). At this time, the surface potential of Sample 6 is measured for each acceleration condition, so that the energy discrimination voltage can be associated with the measurement depth.

Next, in a case where the cross-sectional shape is a straight hole, a difference between the horizontal deflection amount of the electron beam 2 (primary electron) at 800 eV and the horizontal deflection amount of the primary electron at 2000 eV is calculated for each measurement depth (the dotted line in FIG. 8(*b*)). If the charged potential on the surface is known, it is easy to calculate the deflection amount of the primary electron at each measurement depth for each acceleration voltage.

Next, how much the actually measured edge position changes by changing the acceleration voltage is obtained for each measurement depth (the solid line in FIG. 8(*b*)). If the cross-sectional shape is straight, the edge position measured by changing the acceleration voltage should be equal to the deflection amount of the primary electron. Therefore, it is possible to estimate how much the cross-sectional shape deviates from the straight by obtaining the difference between the dotted line and the solid line in FIG. 8(*b*). With this configuration, the cross-sectional shape of Sample 6 can be estimated. FIG. 8(*c*) illustrates the estimation result.

Figure 9:
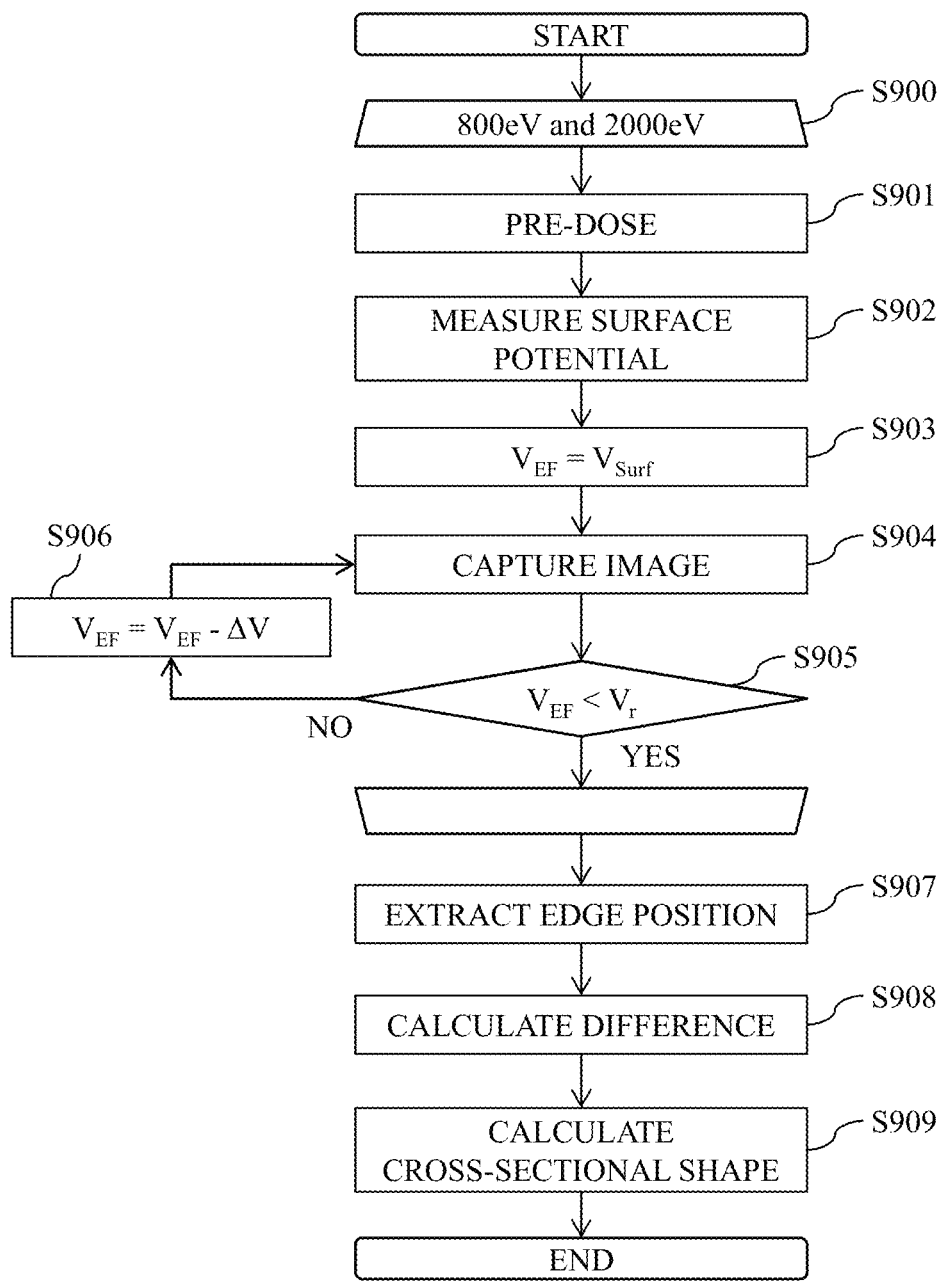
FIG. 9 is a flowchart for describing a procedure for estimating a cross-sectional shape of Sample 6 by the scanning electron microscope according to the second embodiment.

FIG. 9 is a flowchart for describing a procedure for estimating the cross-sectional shape of Sample 6 by the scanning electron microscope according to the second embodiment. Hereinafter, each step of FIG. 9 will be described.

(FIG. 9: Steps S900 to S906)

The charged particle ray device performs the same processing as in steps S701 to S706 for each of the acceleration voltages of 800 eV and 2000 eV.

(FIG. 9: Step S907)

The charged particle ray device extracts an edge position of a cross-sectional shape from each energy discrimination image (EF image) for each position in the depth direction. The charged particle ray device obtains, for each measurement depth, how much the actually measured edge position changes by changing the acceleration voltage. This is equivalent to obtaining the solid line in FIG. 8(*b*). The charged particle ray device further obtains a difference in the deflection amount of the primary electron between the acceleration voltages. This is equivalent to obtaining the dotted line in FIG. 8(*b*).

(FIG. 9: Steps S908 to S909)

The charged particle ray device obtains the difference between the solid line and the dotted line in FIG. 8(*b*) (S908) to estimate the cross-sectional shape of Sample 6 (S909).

Second Embodiment: Summary

The charged particle ray device according to the second embodiment calculates in advance how much the deflection amount of the primary electron changes by changing the acceleration voltage, and measures how much the detection result of the edge position is changed by changing the acceleration voltage, thereby estimating the cross-sectional shape. With this configuration, even for a sample having no reference pattern, the cross-sectional shape can be estimated without breaking the sample.

In the second embodiment, the deflection amount of the primary electron is calculated in advance on an assumption on that the side wall shape is straight, but the invention is not limited thereto. The deflection amount may be calculated by assuming a target machining shape (for example, design data).

Third Embodiment

Figure 10:
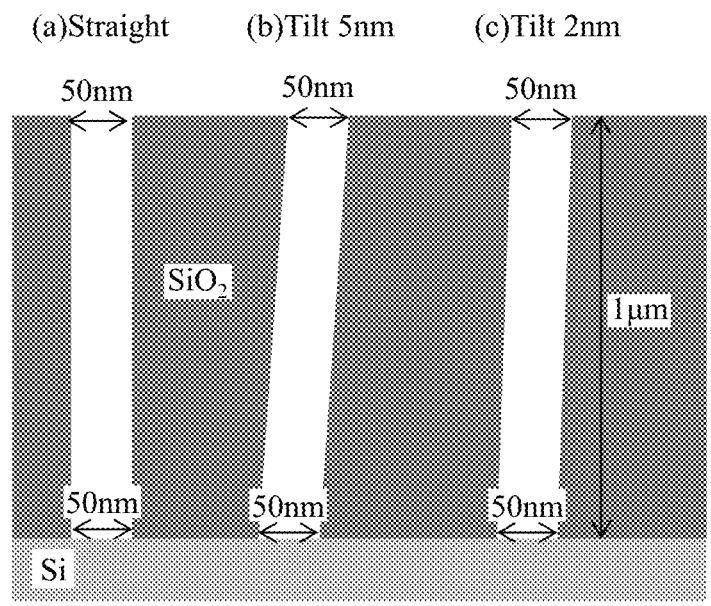
FIG. 10 is a diagram of a side cross section illustrating an example in which an inclined hole is formed in Sample 6.

FIG. 10 is a diagram of a side cross section illustrating an example in which an inclined hole is formed in Sample 6. Herein, three types of patterns will be described. (a) is a straight pattern, (b) is a pattern inclined 5 nm from the surface to the bottom, and (c) is a pattern inclined 2 nm from the surface to the bottom. FIGS. 10(*b*) and 10(*c*) illustrate shapes called a reverse taper. Even when the surface is scanned with the electron beam 2, the electron beam 2 does not hit the side wall, and it is difficult to obtain information on the cross-sectional shape.

Figure 11:
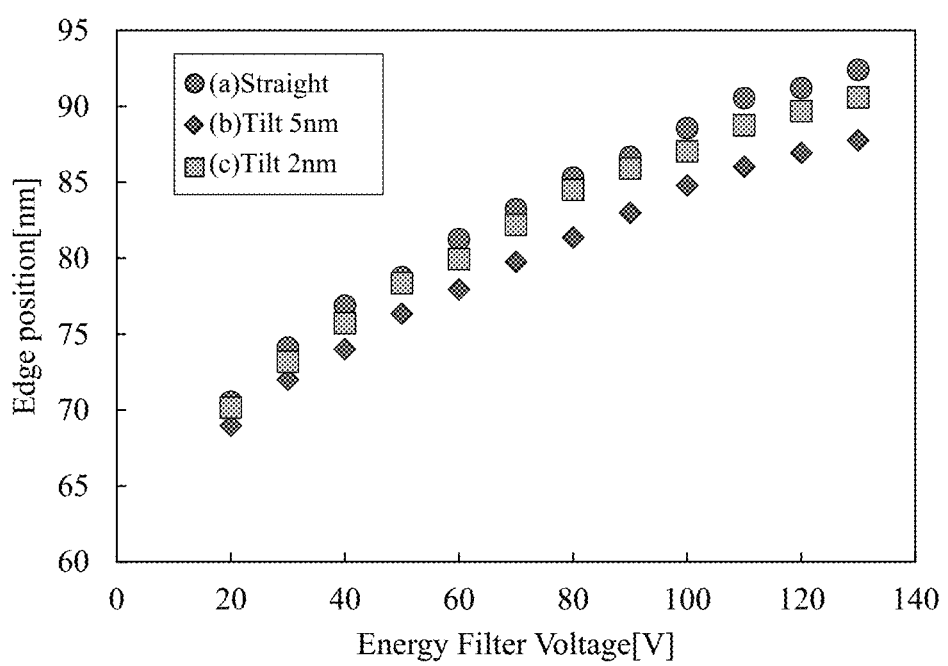
FIG. 11 illustrates a result of detecting an edge position of each pattern using the method described in the first embodiment.

FIG. 11 illustrates the result of detecting the edge position of each pattern using the method described in the first embodiment. In general, in the reverse tapered pattern, the edge of the side wall is arranged inside the edge of the surface, so it is difficult to directly irradiate the electron beam 2 to the side wall. By positively charging the surface of Sample 6 as described in the first embodiment, such side walls can be irradiated with the electron beam 2.

In a case where the electron beam 2 does not reach the side wall due to a large taper angle and deflection by surface charging, the electron beam 2 itself may be tilted by the deflector 4.

Figure 12:
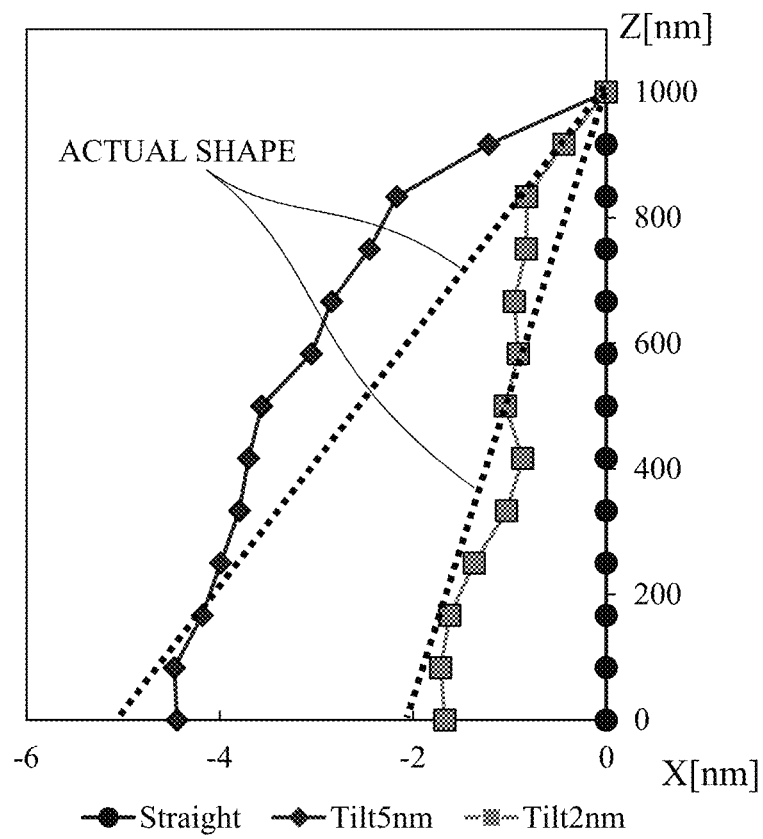
FIG. 12 illustrates a result of estimating a cross-sectional shape based on a difference between an edge position of a reference pattern and a measured edge position.

FIG. 12 illustrates the result of estimating the cross-sectional shape based on the difference between the edge position of the reference pattern and the measured edge position. The dotted line indicates the actual shape, and the solid line indicates the shape estimated from the results of FIG. 11. It can be seen that the actual shape can be almost estimated for both the 5 nm tilt and the 2 nm tilt.

Fourth Embodiment

In the above embodiment, the example in which the cross-sectional shape of the hole of Sample 6 is estimated has been described. In a fourth embodiment of the invention, the description will be given about an example in which the cross-sectional shape of a void existing inside Sample 6 is estimated. Since the configuration of the charged particle ray device is the same as that of the first embodiment, the estimation procedure will be mainly described below.

Figure 13:
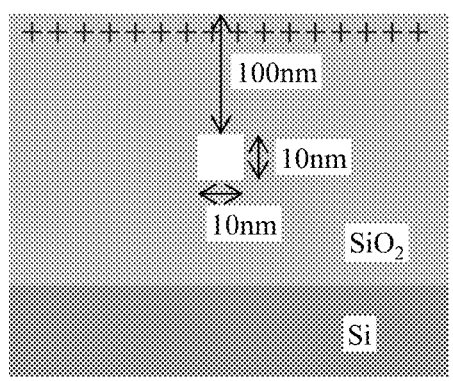
FIG. 13 is a schematic view of a side cross section illustrating an example of a void pattern.

FIG. 13 is a schematic view of a side cross section illustrating an example of a void pattern. Since the SEM is for observing irregularities on the sample surface, it is generally difficult to inspect and measure voids existing inside Sample 6. Even in this case, similarly to the first to third embodiments, the surface of Sample 6 is charged, and the void shape can be estimated by observing the energy discrimination image. Specifically, the potential of the surface of Sample 6 is measured by discriminating the secondary electron 7 using the energy discriminator 9, and the plane position of the void can be estimated based on the potential difference between parts on the surface.

Figure 14:
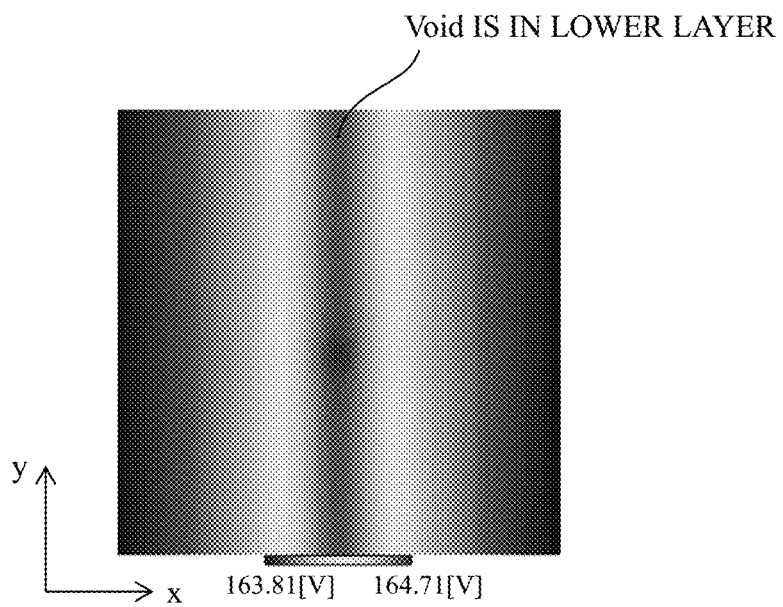
FIG. 14 is a potential distribution diagram on the surface of Sample 6.

FIG. 14 is a potential distribution diagram on the surface of Sample 6. As illustrated in FIG. 13, when a pre-dose is performed on Sample 6 having voids and a positive charge is applied to the surface, the potential of the voids in the lower layer becomes higher than the potential of the other portions, and a potential difference is generated between the respective portions on the surface of Sample 6. Since the secondary electron 7 has the energy of the emitted location as an offset, it is possible to emphasize the contrast of a region having a void in the lower layer in an observation image by performing energy discrimination when detecting the secondary electron 7. In this case, the luminance of a region having no void in the lower layer is used as a reference, and a region where the luminance is higher than the reference luminance by a predetermined threshold or more can be regarded as the plane size of the void.

Figure 15:
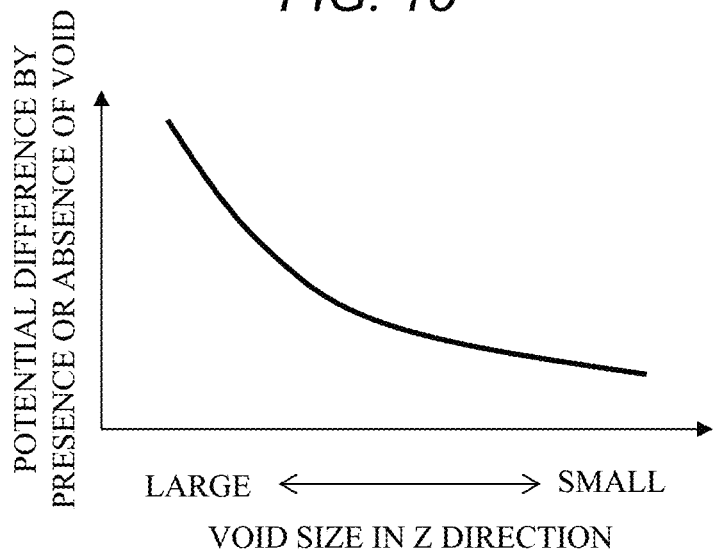
FIG. 15 is a graph exemplifying a correspondence between the size of voids in a depth direction and the potential difference on a sample surface.

FIG. 15 is a graph illustrating the correspondence between the size of the void in the depth direction and the potential difference on the sample surface. Even if the size of the void in the horizontal direction is the same, the surface potential difference illustrated in FIG. 14 differs depending on the size of the void in the depth direction. In other words, the difference between the potential of the portion where the void exists in the lower layer and the potential of the portion where no void exists in the lower layer on the sample surface increases as the size of the void in the depth direction increases. By acquiring the correspondence illustrated in FIG. 15 in advance by experiment or simulation analysis, the size of the void in the depth direction can be estimated.

Fourth Embodiment: Summary

The charged particle ray device according to the fourth embodiment measures the surface potential of each part of Sample 6 using the energy discriminator 9, and compares the measured potential as a reference pattern with a potential distribution having no voids in the lower layer, so that the planar shape of the void can be estimated. Further, by acquiring in advance the correspondence between the surface potential difference and the size of the void in the depth direction, the size of the void in the depth direction can be estimated.

Fifth Embodiment

Figure 16:
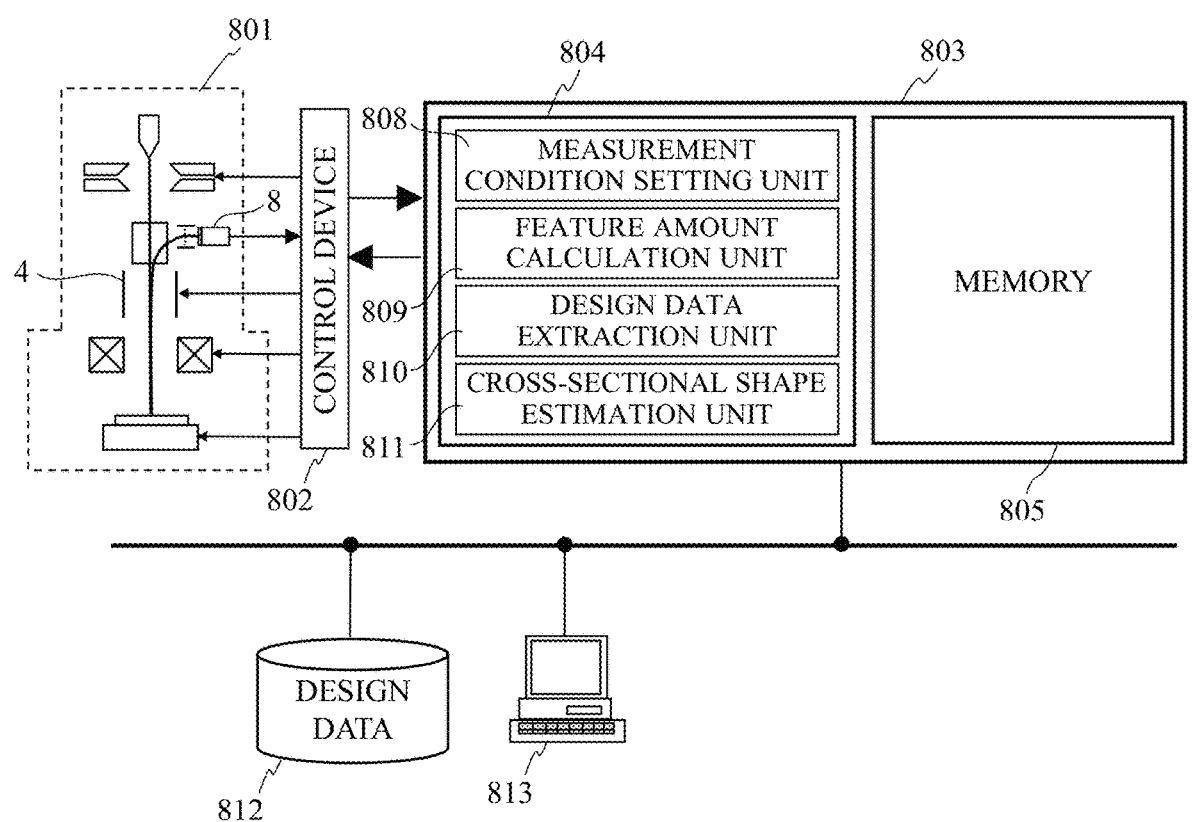
FIG. 16 is a configuration diagram of a cross-sectional shape estimation system according to a fifth embodiment.

FIG. 16 is a configuration diagram of a cross-sectional shape estimation system according to a fifth embodiment of the invention. The control device of the scanning electron microscope has (a) a function of controlling each part of the scanning electron microscope, (b) a function of forming an observation image of Sample 6 based on the detected secondary electron 7, (c) a function of deriving the edge position of the pattern from each image, and (d) a function of deriving the change amount of the edge position between a plurality of images. The arithmetic processing of these functions can be partially or entirely performed by an arithmetic device provided separately from the control device. In the fifth embodiment, a configuration example will be described in which an arithmetic processing device 803 described below performs the arithmetic processing.

The cross-sectional shape estimation system in FIG. 16 includes an SEM main body 801, a control device 802, and the arithmetic processing device 803. The SEM main body 801 is the charged particle ray device according to the first to fourth embodiments. The arithmetic processing device 803 includes an arithmetic processing unit 804 and a memory 805. The arithmetic processing unit 804 supplies a predetermined control signal to the control device 802, and processes the signal acquired by the SEM main body 801. The memory 805 stores acquired image data, recipe (data describing measurement conditions and the like), data describing the reference pattern described in the first to fourth embodiments, data described in FIG. 15, and the like. The control device 802 and the arithmetic processing device 803 may be integrally configured.

The deflector 4 scans the electron beam 2. The detector 8 captures the secondary electron 7 emitted from Sample 6. An A/D converter built in the control device 802 converts the detection signal output from the detector 8 into a digital signal. The arithmetic processing device 803 includes arithmetic processing hardware such as a central processing unit (CPU), and the hardware realizes each function by performing arithmetic processing on the detection signal.

The arithmetic processing unit 804 includes a measurement condition setting unit 808, a feature amount calculation unit 809, a design data extraction unit 810, and a cross-sectional shape estimation unit 811. The measurement condition setting unit 808 sets measurement conditions such as the scanning conditions of the deflector 4 based on the measurement conditions input by an input device 813. The feature amount calculation unit 809 obtains a profile in a Region Of Interest (ROI) input by the input device 813 from the image data. The design data extraction unit 810 reads the design data from a design data storage medium 812 according to the conditions input by the input device 813, and converts vector data into layout data as needed. The cross-sectional shape estimation unit 811 estimates the cross-sectional shape of Sample 6 by using the energy discrimination images obtained by the feature amount calculation unit 809 by the method described in the first to fourth embodiments.

The arithmetic processing unit 804 and each functional unit thereof can be configured using hardware such as a circuit device that implements the function, or can be configured by an arithmetic device executing software that implements the function.

Figure 17:
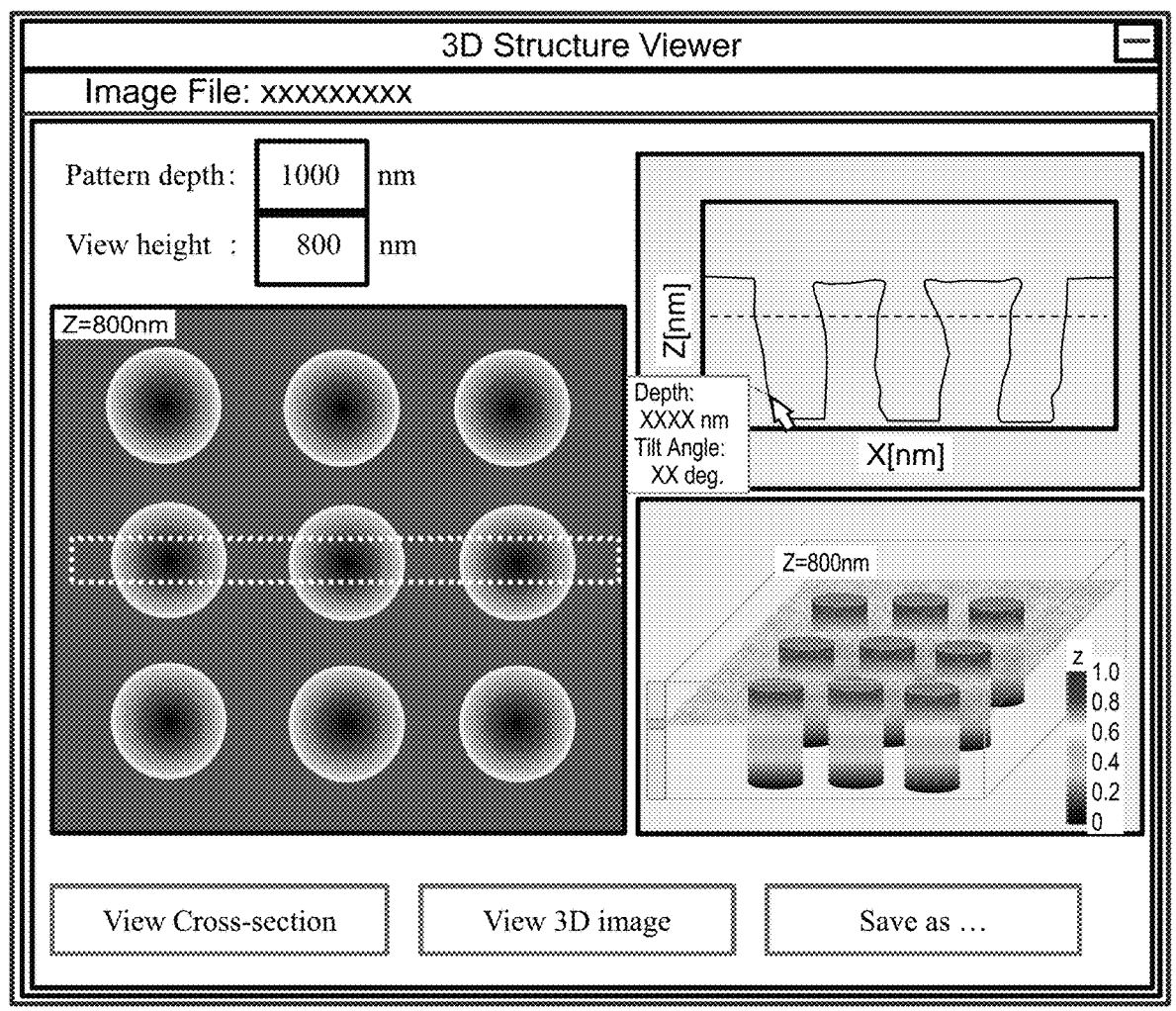
FIG. 17 is an example of a GUI displayed by an input device 813.
Figure 18:
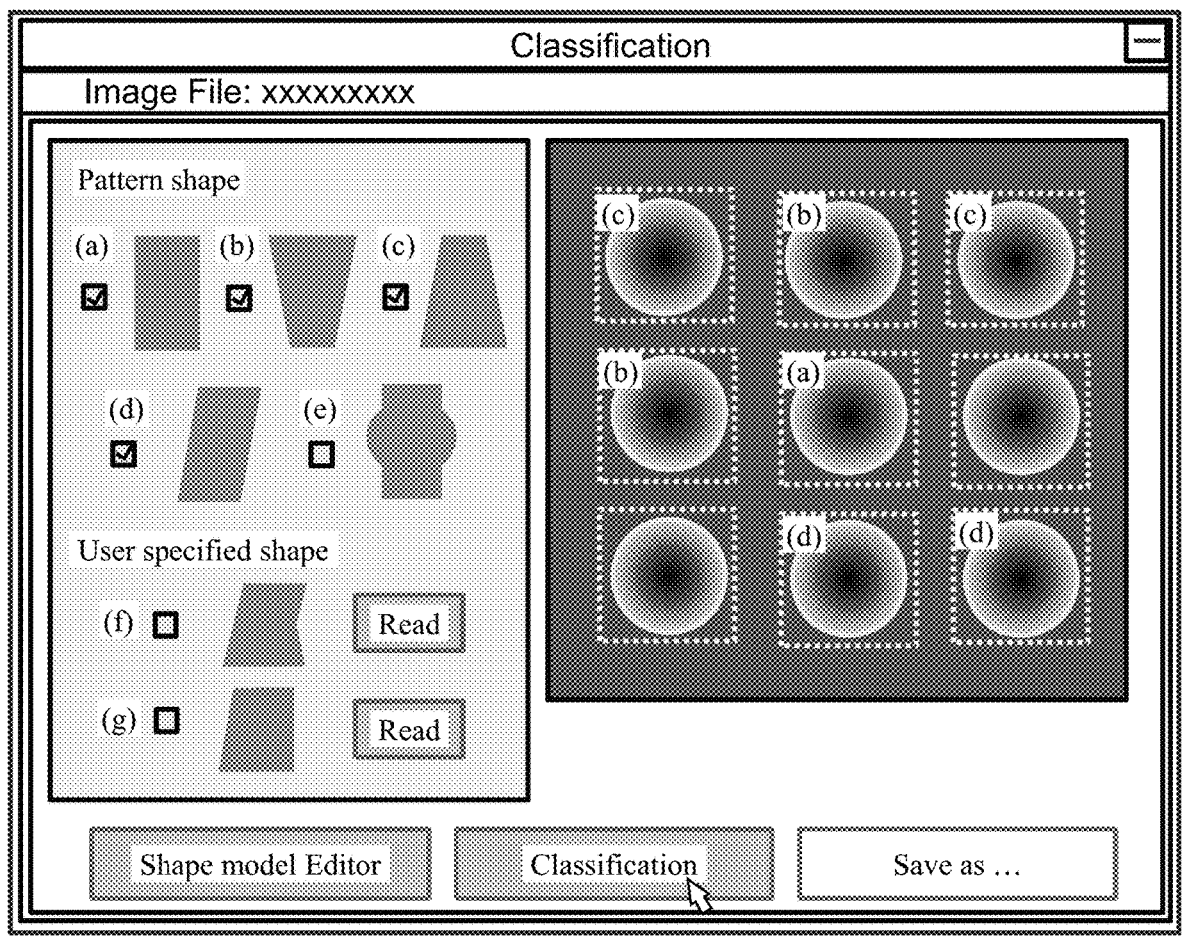
FIG. 18 is an example of a GUI for pattern classification of an estimated cross-sectional shape.
Figure 19:
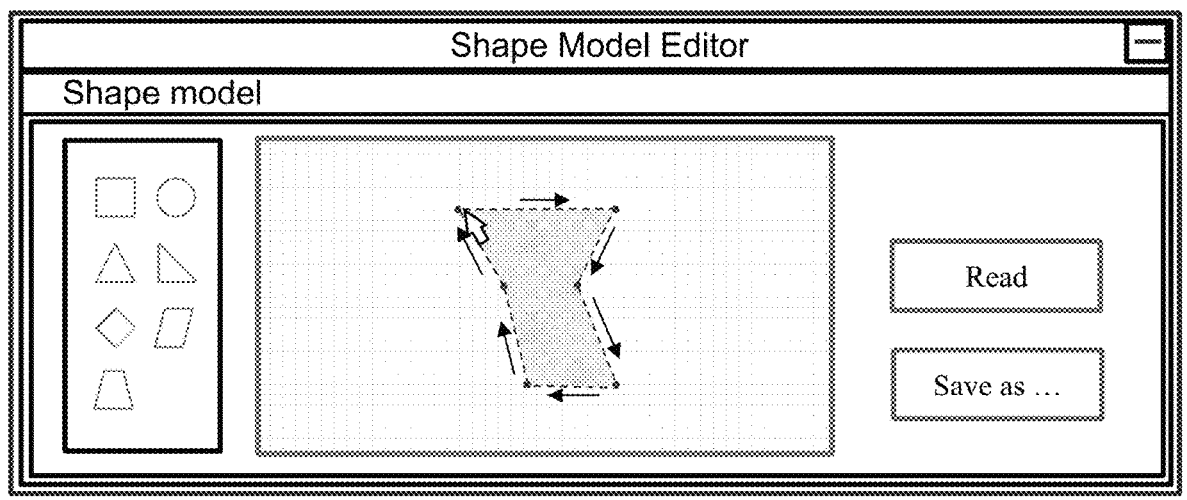
FIG. 19 is an example of a GUI for a user to edit a cross-sectional shape model.

The input device 813 is connected to the arithmetic processing device 803 via a network, and provides an operator with a Graphical User Interface (GUI) that displays an observation image of Sample 6, an estimation result of the cross-sectional shape, and the like (FIGS. 17 to 19 described later). For example, image data and design data can be displayed together as a three-dimensional map.

FIG. 17 is an example of a GUI displayed by the input device 813. The operator sets the pattern depth of the image. The operator can also view the XY cross-sectional image at an arbitrary depth by specifying the cross-sectional height (View height) viewed from the bottom of the sample.

The arithmetic processing device 803 estimates the three-dimensional structure of Sample 6, so that the entire Sample 6 can be three-dimensionally displayed as illustrated in the lower right image of FIG. 17. The lower right three-dimensional image can be arbitrarily rotated with a mouse pointer. The operator may also specify a cross-sectional height (View height) from the three-dimensional image in the lower right drawing. When a two-dimensional area is specified in the XY cross-sectional image, the result of estimating the cross-sectional shape (XZ or YZ cross section) in that area is displayed in the upper right column (cross-sectional shape window) in FIG. 17. When the mouse cursor is moved to an arbitrary position in the cross-sectional shape window, the depth and the inclination angle of the side wall of a place specified by the cursor are displayed. The created image and cross-sectional shape waveform can be saved under a name.

FIG. 18 is an example of a GUI for pattern classification of the estimated cross-sectional shape. The arithmetic processing device 803 classifies the cross-sectional shape based on a preset pattern shape (straight, forward taper, reverse taper, inclination, bowing), as well as an arbitrary shape model edited by a user. The classification result is displayed for each pattern on the SEM image on the right side of FIG. 18. The classification result can be stored as an image or text data.

FIG. 19 is an example of a GUI for a user to edit a cross-sectional shape model. By clicking the vertices of the pattern with the mouse on the model editing area, the closed space can be set as a pattern. Alternatively, the shape can be set by arranging and combining shape templates illustrated on the left side of FIG. 19 on the model editing area. The edited shape model can be saved, and a model created in the past can be read and edited.

[Modifications of Invention]

The invention is not limited to the above embodiments, but various modifications may be contained. For example, the above-described embodiments of the invention have been described in detail in a clearly understandable way, and are not necessarily limited to those having all the described configurations. In addition, some of the configurations of a certain embodiment may be replaced with the configurations of the other embodiments, and the configurations of the other embodiments may be added to the configurations of a certain embodiment. In addition, some of the configurations of each embodiment may be omitted, replaced with other configurations, and added to other configurations.

In the above embodiment, it is assumed that the primary electron reaches the bottom of Sample 6. Therefore, the charged particle ray device may derive a range of the acceleration voltage at which the primary electron can reach the bottom of the pattern when the deflection amount of the primary electron in each acceleration condition is obtained on the basis of the pattern size (hole diameter, groove width, etc.) and a pattern depth. Further, a combination of the acceleration voltage range and the optimal acceleration condition may be presented on the GUI described in the fifth embodiment. In a case where the electron beam 2 does not reach the bottom of the pattern even after changing the acceleration condition, the electron beam 2 itself may be tilted. In a case where the electron beam 2 is tilted, the cross-sectional shape of Sample 6 may be estimated based on an image of the reference pattern obtained by irradiating the tilted electron beam.

Each of the processes described in the first to fourth embodiments may be performed on an arithmetic device (for example, the control device 802) included in the charged particle ray device itself, or the charged particle ray device itself acquires only the detection signal, and another arithmetic device (for example, the arithmetic processing device 803) may acquire the data describing the detection signal and perform the same processing. The processing performed by each arithmetic device may be performed using hardware such as a circuit device that implements the arithmetic processing, or may be performed by executing software that implements the arithmetic processing by the arithmetic device.

REFERENCE SIGNS LIST 1 electron gun
2 electron beam
3 condenser lens
4 deflector
5 objective lens
6 sample
7 secondary electron
8 detector
801 SEM main body
802 control device
803 arithmetic processing device
804 arithmetic processing unit
805 memory
808 measurement condition setting unit
809 feature amount calculation unit
810 design data extraction unit
811 cross-sectional shape estimation unit
812 design data storage medium
813 input device

The invention claimed is:

1. A charged particle ray device for irradiating a sample with a charged particle ray, comprising:
a charged particle source that emits the charged particle ray;
a detector that detects a charged particle generated by irradiating the charged particle ray on the sample and outputs a detection signal indicating an intensity of the charged particle;
an energy discriminator that discriminates the charged particle according to the energy of the charged particle before the detector detects the charged particle;
a storage unit that stores the detection signal output by the detector for a reference sample as a reference pattern,
wherein the charged particle ray device is configured to:
estimate a cross-sectional shape of the sample using the detection signal output by the detector;
acquire the detection signal for each of different discrimination conditions of the energy discriminator, and
estimate the cross-sectional shape of the sample by comparing the detection signal acquired for each of the discrimination conditions and the reference pattern.

2. The charged particle ray device according to claim 1,
wherein the reference pattern describes, for each position in a depth direction of the reference sample, a position of an edge portion of a cross-sectional shape of the reference sample,
wherein the energy discriminator is configured to selectively discriminate the charged particle obtained from a specific position in the depth direction of the sample according to the discrimination conditions,
wherein the charged particle ray device acquires the detection signal for each of the different discrimination conditions, thereby acquiring the position of the edge portion of the cross-sectional shape of the sample for each position in the depth direction of the sample corresponding to the discrimination conditions, and wherein the charged particle ray device compares the position of the edge portion of the cross-sectional shape of the reference sample with the position of the edge portion of the cross-sectional shape of the sample for each position in the depth direction of the sample, thereby estimating the cross-sectional shape of the sample.

3. The charged particle ray device according to claim 1, wherein the charged particle ray device:
acquires, as the reference pattern, a change amount in which a deflection amount of the charged particle ray changes by changing an acceleration voltage of the charged particle ray for each position in a depth direction of the sample,
for each different acceleration voltage of the charged particle ray, acquires the position of the edge portion of the cross-sectional shape of the sample for each position in the depth direction of the sample, and
compares, for each position in the depth direction of the sample, the change amount described by the reference pattern with the position of the edge portion of the cross-sectional shape of the sample obtained for each of the different acceleration voltages, thereby estimating the cross-sectional shape of the sample.

4. The charged particle ray device according to claim 1, wherein the reference pattern describes a potential distribution of a surface of the reference sample when the reference sample having no cavity therein is charged,
wherein the energy discriminator is configured to selectively discriminate the charged particle generated from a position having a specific potential on the surface of the sample according to the discrimination conditions, and
wherein the charged particle ray device estimates, on the surface of the sample, the position of the cavity existing inside the sample by comparing the potential distribution described by the reference pattern with the detection signal for each of the discrimination conditions.

5. The charged particle ray device according to claim 4, wherein the storage unit stores a difference between a potential at a position where the cavity is projected on the surface of the sample and a potential at a position other than the projected position on the surface of the sample as cavity size data described for each size in a depth direction of the cavity, and
wherein the charged particle ray device estimates the size in the depth direction of the cavity existing inside the sample by comparing the difference described by the cavity size data with the detection signal for each of the discrimination conditions.

6. The charged particle ray device according to claim 4, wherein the sample has a hole,
wherein the charged particle ray device further includes a deflector that deflects the charged particle ray, and
wherein the deflector irradiates the charged particle ray to the bottom of the hole by deflecting the charged particle ray and tilting an incident angle at which the charged particle ray enters the sample.

7. The charged particle ray device according to claim 1, wherein the charged particle source irradiates the sample with the charged particle ray to generate a potential difference in a depth direction of the sample,
wherein the reference pattern describes a deflection amount by which the charged particle ray is deflected by a potential difference between the surface and the bottom of the reference sample, and wherein the charged particle ray device estimates the cross-sectional shape of the sample by comparing the amount of deflection of the charged particle beam with the amount of deflection described by the reference pattern.

8. The charged particle ray device according to claim 1, wherein the charged particle ray device generates an image representing the cross-sectional shape of the sample, and
wherein the charged particle ray device further includes a display unit that displays an image of the cross-sectional shape of the sample.

9. The charged particle ray device according to claim 8, wherein the charged particle ray device calculates a deflection amount of the charged particle ray using an acceleration voltage of the charged particle ray,
wherein the charged particle ray device calculates a range of the acceleration voltage at which the charged particle ray can reach the bottom of the sample using the deflection amount and the size of the sample in a depth direction, and
wherein the display unit displays a range of the acceleration voltage calculated by the charged particle ray device.

10. The charged particle ray device according to claim 8, wherein the charged particle ray device estimates a three-dimensional shape of the sample by estimating the cross-sectional shape of the sample for each position in a depth direction of the sample, and
wherein the display unit displays a three-dimensional shape of the sample estimated by the charged particle ray device.

11. The charged particle ray device according to claim 8, wherein the charged particle ray device classifies the cross-sectional shape of the sample into one of a tapered shape, an reverse taper shape, a bowing shape, an inclined shape, or a shape defined by a user of the charged particle ray device, and displays a result of the classification of the charged particle ray device.

12. A non-transitory computer readable storing thereon a cross-sectional shape estimation program for causing a computer to execute a process of estimating a cross-sectional shape of a sample, wherein the program when executed by the computer, configures the computer to:
acquire detection signal data describing a detection signal representing an intensity of a charged particle generated by irradiating the sample with a charged particle ray,
read a reference pattern describing a detection signal representing the intensity of the charged particle generated by irradiating a reference sample with the charged particle ray, and
estimate a cross-sectional shape of the sample using the detection signal data and the reference pattern,
wherein the detection signal data is acquired by discriminating the charged particle according to energy of the charged particle before the charged particle is detected by a detector, and
wherein, in estimating a cross-sectional shape of the sample using the detection signal data and the reference pattern, the computer is configured to compare the reference pattern with the detection signal acquired for each different discrimination condition to estimate the cross-sectional shape of the sample.

* * * * *